July 9, 1968 A. C. BRADHAM III 3,392,256

METHOD AND APPARATUS FOR ASSEMBLING ELECTRONIC COMPONENTS TO PRINTED CIRCUIT BOARDS

Filed June 24, 1965 4 Sheets-Sheet 1

Allen C. Bradham III,
Inventor.
Koenig, Senniger, Powers and Leavitt,
Attorneys.

July 9, 1968 A. C. BRADHAM III 3,392,256

METHOD AND APPARATUS FOR ASSEMBLING ELECTRONIC COMPONENTS TO PRINTED CIRCUIT BOARDS

Filed June 24, 1965 4 Sheets-Sheet 2

United States Patent Office 3,392,256

Patented July 9, 1968

3,392,256

METHOD AND APPARATUS FOR ASSEMBLING ELECTRONIC COMPONENTS TO PRINTED CIRCUIT BOARDS

Allen C. Bradham III, Houston, Tex., assignor to Texas Instruments Incorporated, Dallas, Tex., a corporation of Delaware Filed June 24, 1965, Ser. No. 466,574
24 Claims. (Cl. 219—79)

This invention relates to means for assembling electronic network components and more particularly to means for assembling miniature semiconductor networks to an essentially flat printed circuit board.

Among the several objects of the invention may be noted the provision of means for holding miniature network components in a preselected arrangement to facilitate their connection to a circuit board; the provision of apparatus for automatically connecting components so held to a circuit board; the provision of a jig for holding electronic network components, said jig itself constituting a program for instructing apparatus automatically to interconnect the components held therein with a circuit board; the provision of automatic circuit interconnecting apparatus which seeks out components to be interconnected into the circuit and which does not require a separate internal program for each different circuit to be assembled; the provision of high-capacity apparatus which can assemble a large number of circuits in a short time; the provision of such apparatus which produces lead connections which from connection to connection are consistent in quality; and the provision of such apparatus which is relatively simple in construction, inexpensive and reliable in operation. Other objects and features will be in part apparent and in part pointed out hereinafter.

Briefly, apparatus according to the invention includes a jig for holding a plurality of miniature electronic network components for connection to a circuit board. The jig includes a grid having a plurality of openings therein distributed in a regular pattern. A plurality of inserts fit within selected ones of the openings, each of the inserts having a nest for receiving individual ones of the network components. The assembled grid containing the inserts provides apertures through which a lead connecting tool such as a welder may be inserted. By securing a grid with contained inserts to a circuit board, components may be connected to the circuit board in any of a large number of configurations.

In another aspect, apparatus according to the invention includes automatic lead connecting apparatus which according to methods of the invention operates on components held in the jig described above. The automatic lead connecting apparatus includes a lead connecting tool adapted to fit within the apertures provided by the grid and inserts for connecting a component lead to a conductor on the circuit board. The grid by movement in relation to the tool is scanned to register the tool with each of the openings in order, and the lead connecting means further includes means responsive to the presence of an insert within one of the grid openings for initiating operation of the tool to connect a component held in that insert to the board.

The invention accordingly comprises the apparatus and methods hereinafter described, the scope of the invention being indicated in the following claims.

In the accompanying drawings, in which several of various possible embodiments of the invention are illustrated, FIGURE 1 is a perspective view broadly illustrating an automatic lead welder, no details being shown;

Corresponding reference characters indicate corresponding parts throughout the several views of the drawings.

Figure 1:
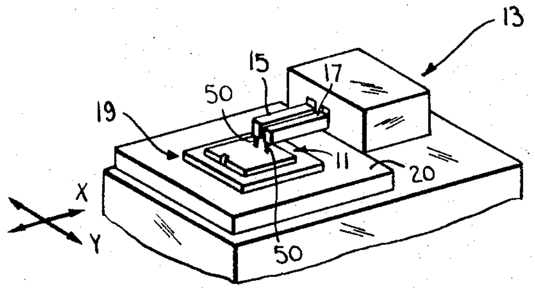
Figure 2:
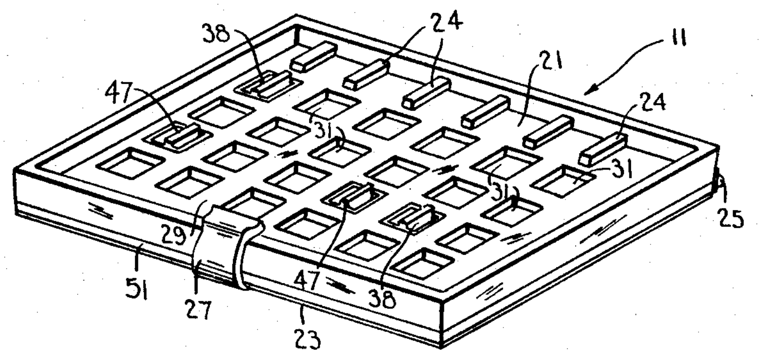
FIGURE 2 is a perspective view of a jig for holding a plurality of miniature semiconductor electronic networks in registration with a circuit board.

Referring now to the drawings, there is shown in FIGURE 2 a jig 11 for clamping miniature semiconductor networks in a preselected array against a printed circuit board. The jig includes an array of openings through which welding electrodes may be inserted for welding the network terminals to conductors on the printed circuit board. As a preliminary matter and before describing the jig in detail, it may be noted that the lead interconnection is advantageously accomplished with a welder of the type illustrated generally in FIGURE 1. The welder 13 shown in FIGURE 1 includes electrode heads 15 and 17 which are mounted so as to permit vertical movement only. A welder construction which is particularly useful for welding the leads of miniature semiconductor networks is illustrated in coassigned and copending application Serial No. 303,212, filed August 14, 1963. This welding apparatus is operative to perform a complete welding cycle upon initiation thereof without further control.

The jig 11 is positioned under the electrode heads 15 and 17 by means of a so-called XY table 19, which is movable over a platform 20. The XY table 19 permits the jig 11 to be moved in either of two transverse horizontal directions X and Y so that any part of the jig may be brought under the heads 15 and 17 for the welding of component leads to a printed circuit board.

The jig 11 itself is comprised of two major portions, a grid 21 and a backing plate 23, which are hinged together as at 25 and which can be clamped together in a closed position by a clip 27. Grid 21 is made up of a plurality of crossbars 29 which define a right-angularly arranged array of openings 31 extending through the grid in a regular pattern. The openings 31 are rectangular and are adapted to receive inserts 33. Grid 21 and inserts 33 have mating beveled surfaces so that a wedging fit is obtained when an insert is set into an opening 31 from the back. The back of a portion of grid 21 is shown in exploded FIGURE 4 with an insert 33 positioned above one of the openings 31.

Figures 3, 4:
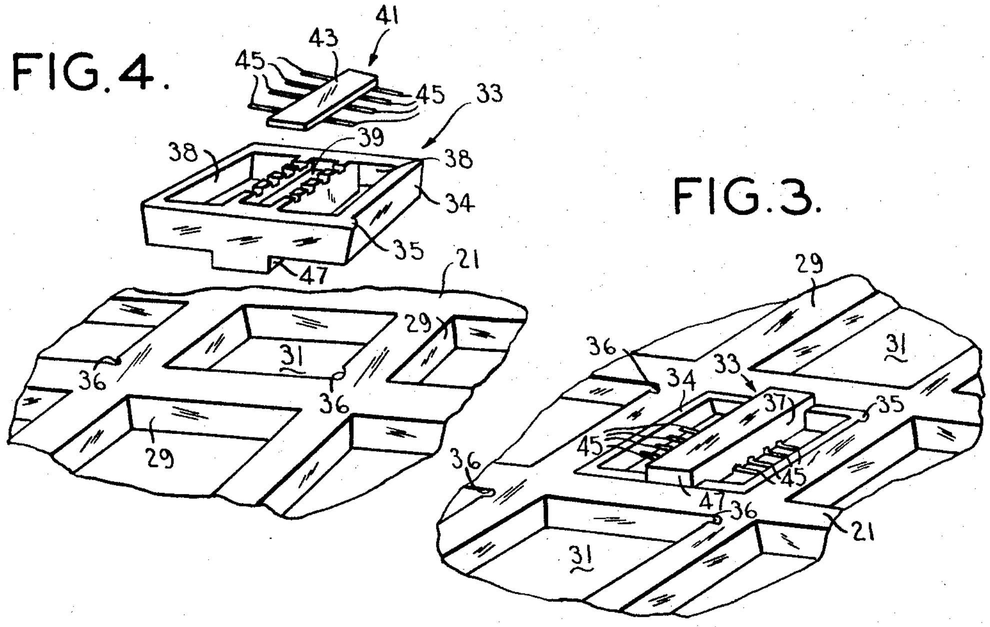
FIGURE 3 is a perspective view to larger scale of a portion of the grid which constitutes a part of the jig of FIGURE 2, together with an insert fitting within one of the openings of the grid.
FIGURE 4 is an exploded view taken from the opposide of the grid of FIGURE 3, showing a grid insert positioned in registration with one of the grid openings and a semiconductor network which is adapted to be held by the insert.

Each insert 33 includes a circumferential rim 34 which includes the tapered surfaces which engage the grid 21. At one corner the rim 34 includes a tab 35 which fits within a mating recess 36 in grid 21 so that the insert can be placed in the grid in one orientation only. A bridge member 37 spans the respective opening 31 between opposite portions of the rim 34, leaving an aperture 38 on either side of the bridge member. The bridge member 37 of each insert 33 includes a nest 39 adapted to snugly receive and orient a miniature semiconductor network such as shown at 41 in FIGURE 4. In FIGURE 4 the network is in the process of insertion in the insert 33, and the latter is in position for insertion in the grid 21. The component or network 41, which may for example be an integrated solid-state circuit, is made up of an elongate rectangular body 43 and is provided with a plurality of usually flat leads 45 extending transversely from the body 43. Each bridge member 37 includes an elongate tab part 47 which projects beyond the front surface of the grid 21 when the insert is positioned in an opening 31 therein, as may be seen best in FIGURES 3 and 4. As explained in greater detail hereinafter, this projecting tab part 47 facilitates the locating of each insert and the network held therein during welding operations.

Figures 5, 6:
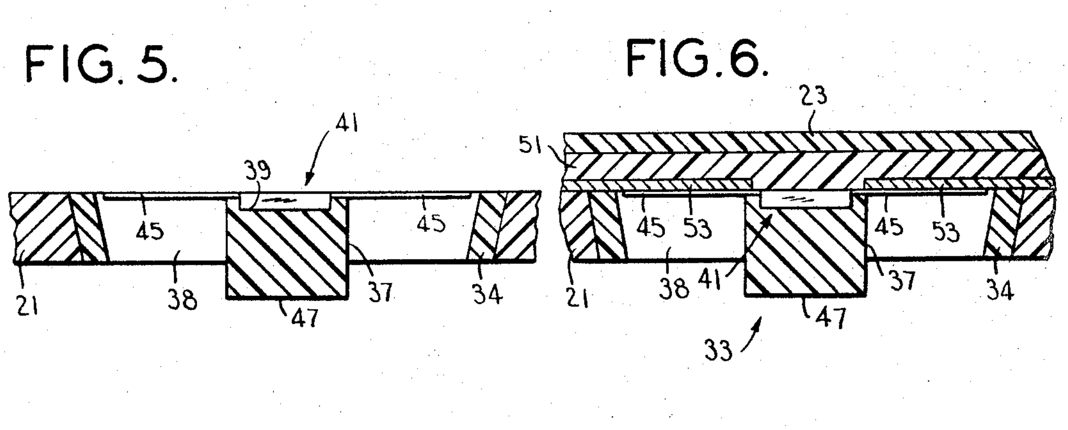
FIGURE 5 is a view in section showing a semi-conductor network held in a grid insert.
FIGURE 6 is a similar view in section, showing a printed circuit board clamped to the grid and semi-conductor networks held therein.

Typically it is desired to locate integrated circuits at scattered positions on a printed circuit board. By providing grid 21 with a large number of openings 31 in relation to the number of component networks typically employed on a given board, a large number of different arrangements or configurations of network placement can be provided which conform to the basic grid pattern. Inserts 33 are provided in only those openings 31 which correspond to desired locations of a network on the completed circuit board. With the grid 21 and the inserts 33 in their inverted positions, that is, inverted from the position shown in FIG. 2, the backing plate 23 being open, a semiconductor network 41 may be deposited in each nest 39, as shown in FIGURE 5. The network leads 45 project laterally from the bridge member 37 into the apertures 38 on either side of the bridge member. A printed circuit board 51, having an appropriate distribution of conductors 53 on the surface thereof, is then laid over the grid 21 with the conductors 53 being on the side of board 51 which is in contact with the network leads 45. Preferably, registration between the various conductors 53 and their respective network leads 45 may be maintained by suitable locating pins (not shown) incorporated into the grid 21 in conventional manner. With printed circuit board 51 in place, the backing plate 23 is then folded over board 51 and secured by clip 27, as shown in FIGURE 2, so that the entire assembly can be reinverted to the position shown in FIGURE 2 preparatory to welding of the leads 45 to the conductors 53 on the underlying circuit board 51.

Figure 8:
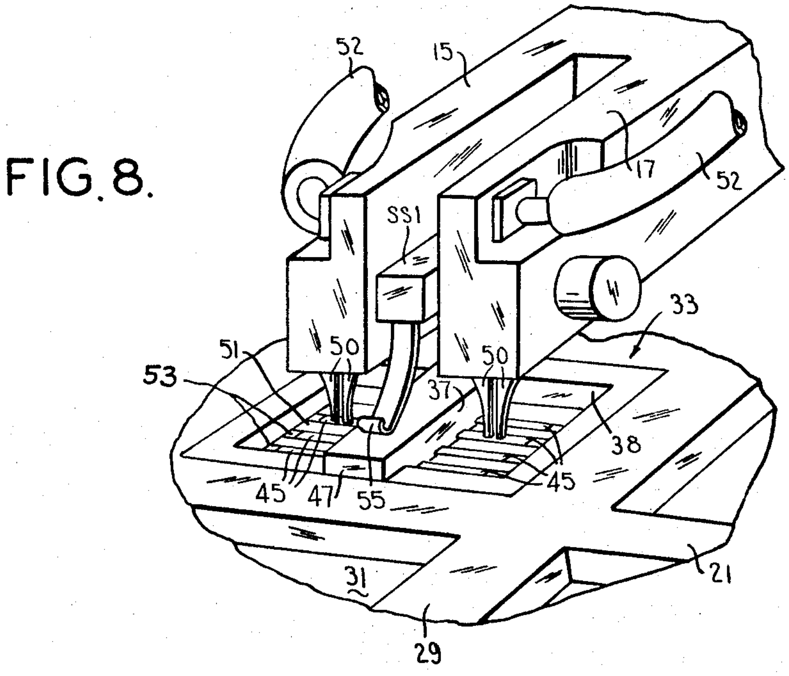
FIGURE 8 is a perspective view showing the operation of welding heads on a semiconductor network held by a grid insert.

The welding heads 15 and 17 of the welder 13 broadly shown in FIGURE 1 are illustrated in greater detail in FIGURE 8 in relation to a network which is held for welding by grid 21 and an insert 33. Each head 15 and 17 includes a pair of electrodes 50 which are positioned for the parallel-gap welding of network leads 45 on opposite sides of the bridging member 37. In each pair, one electrode is grounded and the other is connected to a suitable pulse power source (not shown) through a power lead 52.

Figure 7:
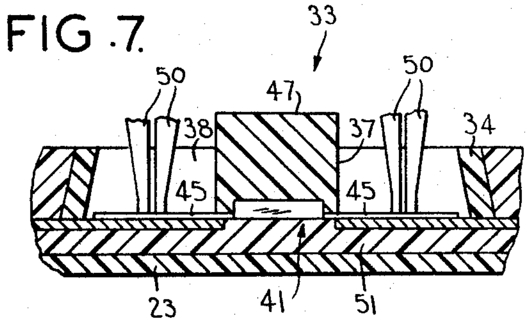
FIGURE 7 is a view in section similar to FIGURE 6 with the grid and circuit board being returned to upright position and showing welding electrodes in operating position passing through apertures in the grid.

As explained in greater detail hereinafter, the table 19 which is incorporated into welder 13 is operated so that the various openings 31 in the grid 21 are successively scanned under the vertically movable welding heads 15 and 17. When an opening 31 containing an insert 33 arrives under the welding heads, the projecting tab part 47 of the bridge member 37 engages a trip lever 55 of a sensing switch SS1 located between the welding heads 15 and 17. Actuation of switch SS1 initiates dropping down of the heads 15 and 17 and instigation of a cycle of welding current, during which opposing pairs of network leads 45 are welded in succession, the electrodes 50 reaching through the grid apertures 38 to reach the leads 45 as seen in FIGURE 7.

As seen in FIGURE 2, the jig 11 also includes row marker tabs 24 which, when the table 19 is fully forward, are detected by a sensing switch SS2 (not shown) located under the welding heads 15 and 17. The switch SS2 gives an indication whenever a row of grid openings is in alignment with the welding heads so that the row can be properly scanned to search out any inserts 33 which may be present.

Figures 9, 10:
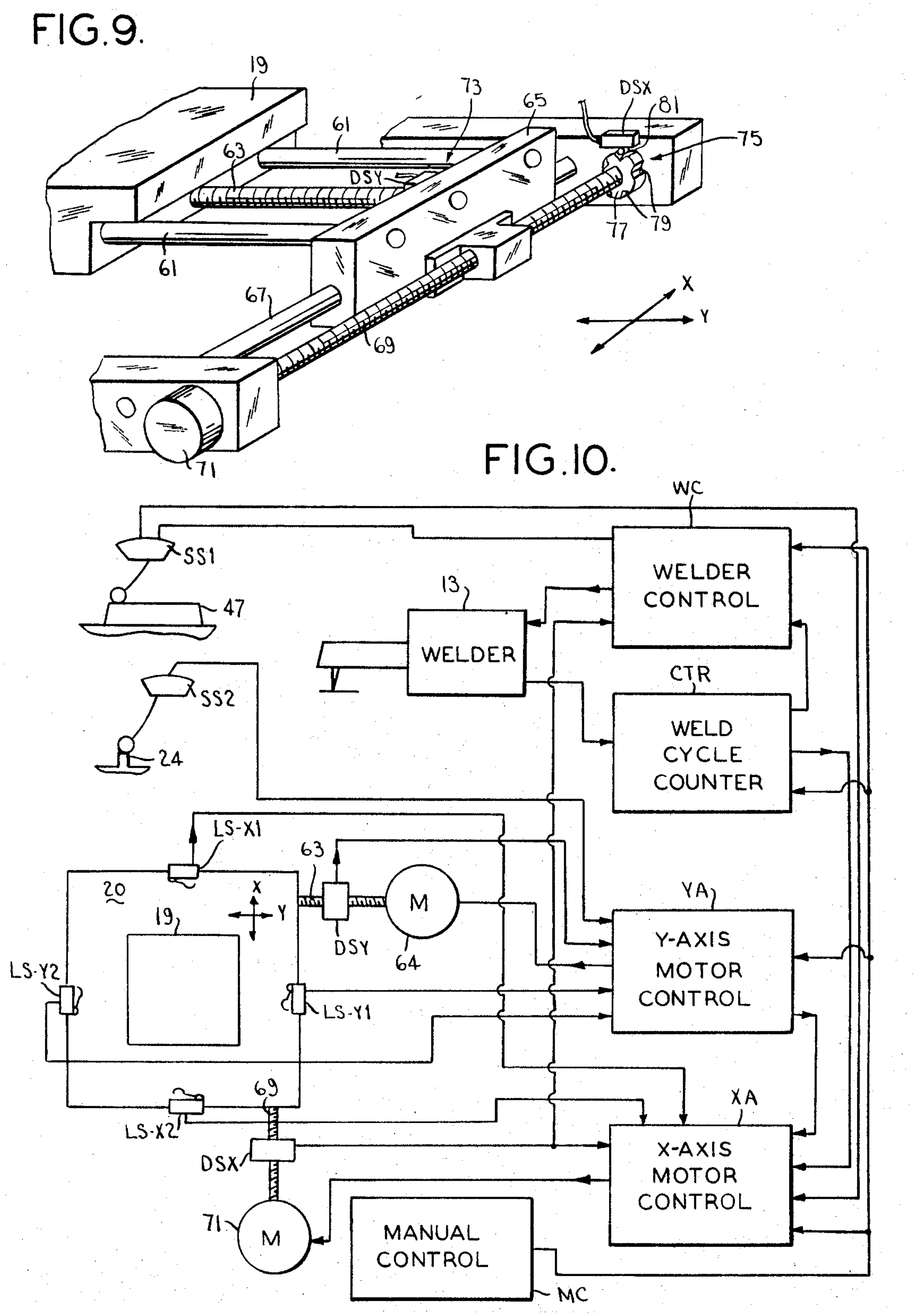
FIGURE 9 is a perspective view partially broken away, showing a table for positioning a component-holding jig in relation to a welding head.
FIGURE 10 is a logic diagram illustrating a control for apparatus for assembling electronic network components.

The positioning of the table 19 with the precision necessary to bring the electrodes 50 into an exact registration with a desired pair of leads 45 is accomplished by means of the position sensing arrangement shown in FIGURE 9. The table 19 is driven along a pair of ways 61 in the Y direction by a lead screw 63. Lead screw 63 is powered by a suitable gear motor 64 (not visible in FIGURE 9). The ways 61 and lead screw 63 are mounted on a pair of carriage members 65 (only one of which is shown in FIGURE 9). The carriage members in turn slide on ways 67 which extend in a lateral direction perpendicular to the length of ways 61, i.e., in the X direction. The carriages 65 are driven along the ways 67 by a lead screw 69 which is powered by a gear motor 71. The energization of the gear motors which drive the traversing lead screws 63 and 69 is effected by control circuitry described hereinafter.

As it is desirable to position the table 19 at various positions which are separated by integral multiples of the network lead spacing, e.g., 50 mils, a method of precisely fixing positions at these spacings is provided. For this purpose each lead screw 63 and 69 is provided with a detent-and-switch device 73 and 75, respectively. The detent device 75 is constituted by a disc 77 carried by lead screw 69 and having a series of notches 79 cut into the periphery thereof. A spring-loaded roller 81 is urged against the periphery of disc 77 and thus, as it drops into each notch 79, it tends to hold the lead screw 69 in the corresponding discrete position. As roller 81 drops into each notch 79 it actuates a switch DSX which is interconnected with the control circuitry as described hereinafter. The detent device 73 similarly operates a switch DSY in response to movement in the transverse direction. Assuming that the pitch of the lead screws 63 and 69 is such that a single turn will traverse the table 250 mils, five notches 79 are provided in disc 77 so that movement from each notch to the next represents a movement of the table 19 equal to 50 mils.

The logic diagram of FIGURE 10 illustrates the control apparatus which produces the desired cooperative operation of the table 19 and the welder 13. The extremes of travel of the table 19 over platform 20 in the X direction are sensed by limit switches LS–X1 and LS–X2 and in the Y direction by limit switches LS–Y1 and LS–Y2. As described previously, the table 19 is driven in the X direction by motor 71 and in the Y direction by motor 64, the detent switches DSX and DSY being operative to produce signals at each predetermined increment of movement.

As also described previously, the sensing switch SS1 gives a signal whenever a grid opening containing an insert is brought under the welding heads, and the sensing switch SS2 gives a signal in response to a row marker tab 24 when a row of grid openings is brought into alignment with the weld electrodes during travel in the Y direction.

The motor 64 is selectively energized by a Y-axis motor control circuit YA. The control YA receives information from the two limit switches LS–Y1 and LS–Y2 to determine the limits of travel in the Y direction; from the sensing switch SS2 to determine when a row of grid apertures is in alignment with the welding electrodes; and from the detent switch DSY to determine the stopping point for row alignment while the switch SS2 is actuated.

The motor 71 is selectively energized by an X-axis motor control XA. Control XA receives information from the X-axis limit switches LS–X1 and LS–X2 to determine the limits of travel of table 19 in this direction; from the sensing switch SS1 which determines when a network containing a grid insert is positioned below the welding electrodes; and from the detent switch DSX which determines the exact positions corresponding to the network leads during the operation of sensing switch SS1. The X-axis motor control also receives information from the Y-axis motor control YA upon closure of the limit switch LS–Y2 which signals the end of a welding cycle when the complete traverse in the Y direction has been completed.

Each cycle of operation of welder 13 is initiated by a welder controller WC and each such cycle of operation in turn trips a weld cycle counter CTR. The welder control receives information from the sensing switch SS1 which determines when an insert is positioned below the weld heads; from the X-axis detent switch DSX which determines the exact position of each network lead within the period during which the sensing switch SS1 is in operation; and from the weld cycle counter CTR which determines when a predetermined number of weld cycles has been completed. The weld cycle counter CTR also provides information to the X-axis motor control which indicates when the series of welds for each network is completed.

The welder control WC, the Y-axis motor control YA and the X-axis motor control XA can each be overridden by a manual control MC which is employed for returning the system to a condition suitable for the initiation of a complete welding operation and for performing welding operations not programmed by a network jig according to the present invention.

The operation of the welder is as follows, it being assumed that the table 19 is initially in the upper right-hand corner of the platform 20 as seen in FIGURE 10 so that the welding electrodes are positioned over the lower left-hand portion of the table. The table is initially traversed to the left on the Y-axis until the sensing switch SS2 is contacted by a row tab 24 and the Y-axis motor control stops the table with the grid row being in exact alignment with the welding heads as indicated by the detent switch DSY. Table 19 is then traversed along the X-axis by motor 71 until a grid insert 33 is found as detected by engagement of its program tab 47 with the sensor switch SS1. After the sensing switch SS1 has been actuated, the X-axis motor control, operating under signals from the X-axis detent switch DSX, stops the table at each position corresponding to the spacing of the network leads 45, and the welder control WC initiates a cycle of operation of the welder 13 at each such position. After a predetermined number of welds has been completed as determined by the weld cycle counter CTR, the X-axis motor control XA resumes scanning of the table along the X-axis. After such networks that are in a given row have been welded, the table will contact the limit switch LS–X2. Operation of the switch LS–X2 will cause the X-axis motor control to reverse the rotation of motor 71 and return the table 19 upwardly as seen in FIGURE 10 until switch LS–X1 is contacted. The Y-axis motor control will then cause the motor 64 to move table 19 again to the left until the next row of grid openings is in line with the welder electrodes as determined by the sensing switch SS2 and the detent switch DSY. The apparatus will then search this new row of openings for inserts and will weld the networks held therein.

The apparatus will in this manner search the various grid rows until table 19 has moved completely to the left and contacts limit switch LS–Y2 which, through the controls YA and XA, will stop both of the motors 64 and 71, thereby terminating the welding operations. Thus it can be seen that once the welding apparatus has been properly set up and operations initiated, the apparatus will itself complete all the welds needed accurately and reliably without operator attention. It should also be noted that the apparatus will process circuit boards in which the networks or components being attached thereto are arranged in different configurations since the component holding jig itself functions to program the welder to perform the lead connecting operations at the desired locations. While the lead attaching apparatus is functioning, the operator's activities can advantageously be directed toward loading a second jig with network components and a circuit board for interconnection when the first board is finished.

Figure 11:
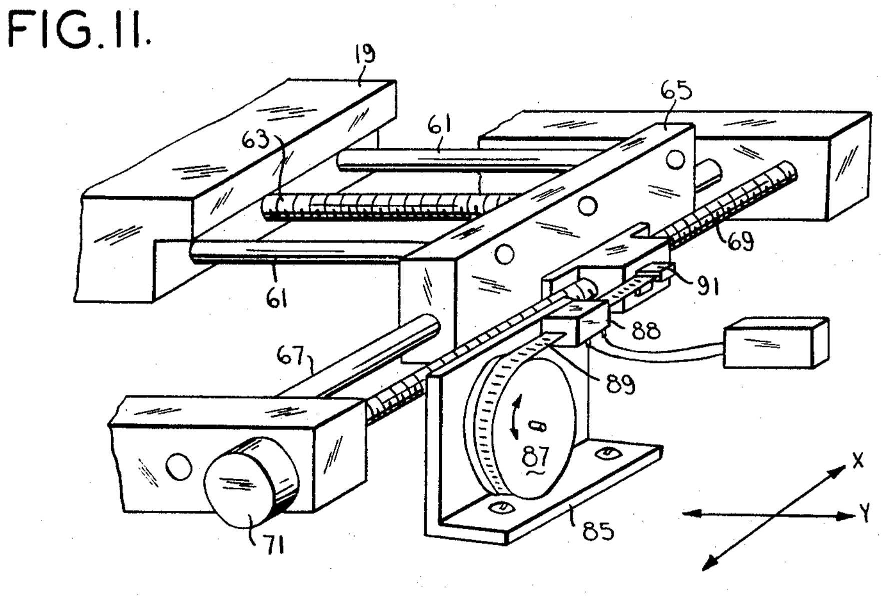
FIGURE 11 is a perspective view with parts broken away of another embodiment of said table.

The positioning of the table 19 with the precision necessary to bring the electrodes 50 into exact engagement with a desired pair of leads 45 may also be accomplished by means of the position-sensing arrangement shown in FIGURE 11. Mounted adjacent lead screw 69 on a fixed bracket 85 is a spring-loaded tape reel 87. A tape 89 having position information punched therein at proper intervals is pulled from reel 87 through a photocell sensor 88 by a clamp fixture 91 attached to the carriage member 65. A similar positioning system (not shown) is employed on the transverse axis. In this case the bracket corresponding to bracket 85 is supported on the carriage of which 61 and 65 are parts. By providing punched information on the tapes at spacings equal to the unit of spacing employed between the leads 45, the photocell tape readers will thereby provide signals each time a lead 45 is positioned directly beneath the welding electrodes 50. As is apparent to those skilled in the art, a photographically prepared tape may also be used.

Figures 12, 13:
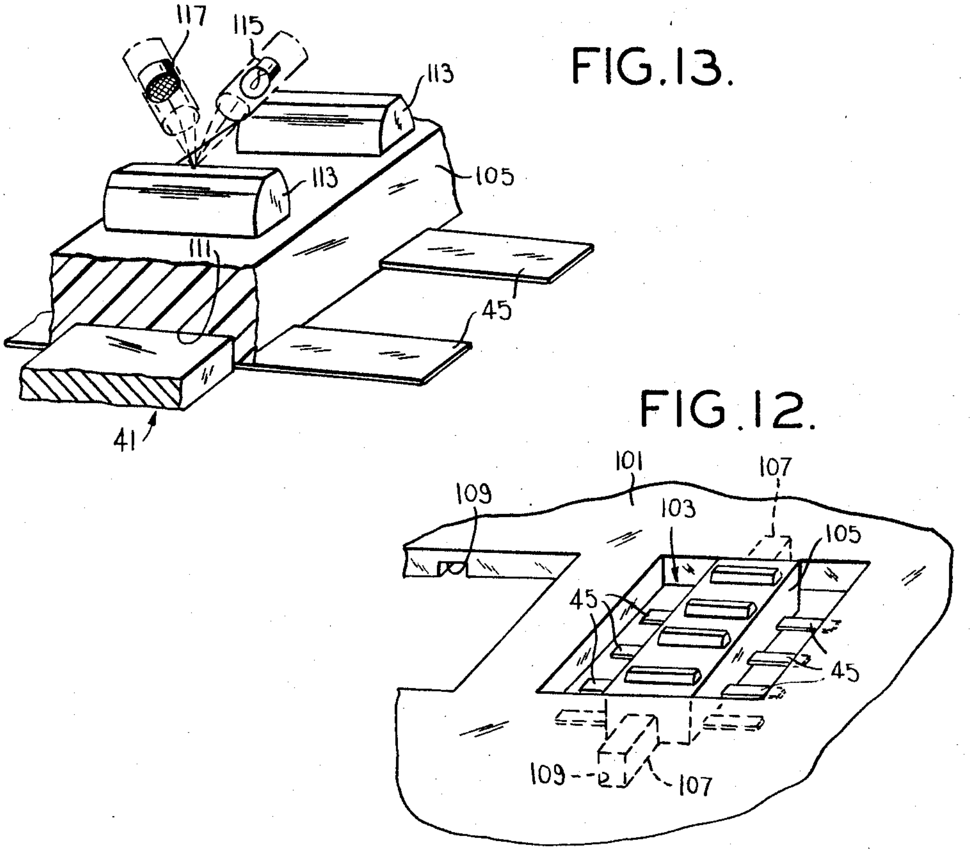
FIGURE 12 is a perspective view with parts broken away of another embodiment of a component-holding jig and insert according to the invention.
FIGURE 13 is a perspective view to larger scale of the insert shown in FIGURE 12, together with apparatus for detecting the actual position of network leads.

Another alternative provision for precisely locating the individual network leads 45 is incorporated into the embodiment illustrated in FIGURES 12 and 13. In this embodiment also a grid 101 is employed which has openings 103 therein distributed in a regular pattern for receiving component-holding inserts. The inserts are constituted by bridge members 105 which span the openings without any circumferential rim such as was used in the previous embodiment. Each bridge member 105 includes at each end projecting lugs 107 which fit snugly within corresponding recesses 109 in the grid 101 for retaining the insert within the grid. The bridge member 105 includes a nest 111 for receiving a semiconductor network 41 with its laterally projecting leads 45. On the back of the bridge member 105, in line with each of the network leads 45, is an aligning tab or tooth 113. As the grid 101 is scanned in the welder so that each opening 103 passes under the welding heads, the welder senses for the presence of a tooth 113 by means of a light source 115 and a photoelectric cell 117. When a tooth 113 is directly in line with the light source 115 and photocell 117, light from the source 115 is reflected by the top surface of the tooth 113 into photocell 117, thereby producing a signal. When no tooth is present the light is scattered or reflected away from the sensor 117 so that no signal is obtained. In this manner a signal is obtained whenever a lead 45 is directly beneath the welding electrodes 50 so as to be positioned for proper welding thereby. This signal is then used to initiate a cycle of operation of the welder.

In view of the above, it will be seen that the several objects of the invention are achieved and other advantageous results attained.

As various changes could be made in the above apparatus and methods without departing from the scope of the invention, it is intended that all matter contained in the above description or shown in the accompanying drawings shall be interpreted as illustrative and not in a limiting sense.

What is claimed is:

1. A jig for holding a plurality of miniature electronic network components having leads for connection to a circuit board, said jig comprising:
a gird having an array of openings therein distributed in a regular pattern;
a plurality of inserts for fitting within selected ones of said openings, said inserts including nests for receiving individual ones of said network components; and
means for securing the grid with inserts having components therein to a circuit board, the assembled grid and inserts providing apertures through which a lead connecting tool may be inserted, whereby components may be assembled for connection to a circuit board in any of a large variety of configurations which lie on a pattern determined by said grid.

2. A jig as set forth in claim 1 in which said insert includes a bridge member which constitutes said nest and which spans the respective opening, leaving said apertures on opposite sides of said bridge member with the component leads projecting into said apertures.

3. A jig as set forth in claim 1 in which each insert includes a rim which fits closely around the peripehry of the respective opening in the grid and a bridge member which constitutes said nest and which spans said rim, leaving an aperture on each side of said bridge member through which a lead connecting tool may operate.

4. A jig for holding a plurality of miniature electronic network components having leads extending therefrom for connection to a substantially flat circuit board, said jig comprising:
a grid having an array of openings therein distributed in a regular pattern;
a plurality of inserts fitting within selected ones of said openings, said inserts including nests for receiving said network components; and
means for securing a grid with nests having components therein to a circuit board, the board being on the side of said grid from which the components are inserted into said nests, with the leads of said components being in registry with corresponding conductors on said circuit board, the assembled grid and inserts providing openings through which a lead connecting tool may be inserted, each of said inserts further including means for indicating its presence in the grid, whereby components may be assembled in any of a large variety of configurations conforming to the grid pattern, and the locating of components for interconnection of the component leads to the circuit board conductors is facilitated by the indications provided by the presence of said inserts.

5. A jig as set forth in claim 4 in which each of said inserts includes a portion projecting beyond said grid for indicating its presence in the grid.

6. A jig for holding a plurality of semiconductor networks for connection to an essentially flat circuit board, each of said networks including an elongate rectangular body and a plurality of transverse leads extending from the body, said jig comprising:
a flat grid including a multiplicity of openings extending therethrough in a regular pattern;
a plurality of inserts for said openings, each insert including a bridge member for spanning the opening and providing an aperture extending through the grid on each side of the bridge member, each bridge member having a nest therein for receiving from one side of said grid the elongate body of a semiconductor network with the leads projecting into said apertures; and
means for securing a grid with inserts holding networks therein to a circuit board, the board being on the side of said grid from which the networks are inserted into said nests, whereby a lead connecting tool may be inserted through said apertures for conneting networks to circuit boards in any of a large variety of configurations conforming to the grid pattern.

7. A jig as set forth in claim 6 in which each of said inserts includes a portion projecting beyond said grid for indicating its presence in the grid.

8. A jig as set forth in claim 6 in which each of said inserts includes a plurality of projections in alignment with respective network lead positions in the nest for indicating the locations of network leads within the grid.

9. A jig for holding a plurality of miniature electronic network components having opposite leads extending therefrom for connection to circuit-forming conductors of a substantially flat circuit board, said jig comprising:
a grid having a rectangular array of substantially rectangular openings therein distributed in a regular pattern;
a plurality of rectangular frames fitting within selected ones of said openings, said inserts including bridging portions forming nests for receiving said network components; and
means for securing a grid with frames having components therein to a circuit board, the board being on one side of said grid from which the frames are inserted, with the leads of said components being in registry with corresponding conductors on said circuit board, the assembled grid and inserts with their bridging portions providing openings through which lead connecting tool means may be inserted, each of said bridging portions further including means for indicating on the opposite side of the grid its presence in the grid, whereby components may be assembled in any of a large variety of configurations conforming to the grid pattern, and the locating of components for interconnection of the component leads to the circuit board conductors is facilitated by the indications provided by the presence of said inserts.

10. A jig for holding a plurality of miniature electronic network components having opposite leads extending therefrom for connection to circuit-forming conductors of a substantially flat circuit board, said jig comprising:
a grid having a rectangular array of substantially rectangular openings therein distributed in a regular pattern and forming sockets;
a plurality of bridge-forming inserts fitting within the sockets of selected ones of said openings, said inserts including nests for receiving said network components; and
means for securing a grid with inserts having components therein to a circuit board, the board being on the one side of said grid from which the inserts are inserted into the sockets, with leads of said components being in registry with corresponding conductors on said circuit board, the assembled grid and bridge-forming inserts providing openings through which lead connecting tool means may be inserted, each of said inserts further including means for indicating on the opposite side of the grid its presence in the grid, whereby components may be assembled in any of a large variety of configurations conforming to the grid pattern, and locating of components for interconnection of the component leads to the circuit board conductors is facilitated by the indications provided by the presence of said inserts.

11. Apparatus for connecting a plurality of miniature electronic network components to a circuit board, said apparatus comprising:
a grid having a plurality of openings therein distributed in a regular pattern;
a plurality of inserts fitting within selected ones of said openings, said inserts including nests for receiving individual ones of said network components;
means for securing a grid with inserts having components therein to a circuit board, the assembled grid and inserts providing apertures through which a lead connecting tool may be inserted; and automatic lead connecting means including a lead connecting tool adapted to fit within said apertures for connecting a component lead to a conductor on said board, means for scanning said grid to bring said tool into registration with each of said openings in order, and means responsive to the presence of an insert within one of said grid openings for initiating operation of said tool to connect a component held in that insert to said board, whereby components may be connected to a circuit board in any of a large variety of configurations which conform to the pattern of said grid.

12. Apparatus as set forth in claim 11 in which each of said inserts includes a portion projecting beyond said grid and in which said lead connecting means includes detecting means for sensing the presence of said portion at said connecting tool for initiating operation of said tool.

13. Apparatus as set forth in claim 11 in which said lead connecting means includes a welder.

14. Apparatus as set forth in claim 13 in which said weller includes electrodes for parallel-gap welding a component lead to a conductor on a circuit board.

15. Apparatus as set forth in claim 11 in which said lead connecting means includes means for making a predetermined series of lead connections at spaced positions within each opening within which an insert is detected.

16. Apparatus as set forth in claim 11 wherein said grid is scanned relative to said tool on a table which is translatable in at least two transverse directions.

17. Apparatus as set forth in claim 16 in which said lead connecting means includes means for moving said table in predetermined increments of distance.

18. Apparatus as set forth in claim 17 in which said means for moving said table includes a lead screw.

19. Apparatus as set forth in claim 18 in which said lead screw is provided with detent means for indexing said table at predetermined incremental spacings.

20. Apparatus as set forth in claim 16 in which a tape carrying displacement information is moved in synchronism with said table through a tape reading sensor for indicating the position of said table to said scanning means.

21. Apparatus as set forth in claim 17 in which said means for scanning includes limit switches for reversing the direction of movement of said table at the end of its travel.

22. Apparatus for connecting a plurality of miniature electronic networks to a circuit board, each of said networks including an elongate rectangular body and a plurality of transverse leads extending from the body, said apparatus comprising:

a flat grid including a multiplicity of openings extending therethrough in a regular pattern;

a plurality of inserts for said openings, each insert including a bridge member for spanning the opening and providing an aperture extending through the grid on each side of the bridge member, each bridge member having a nest therein for receiving from one side of said grid the elongate body of a semiconductor network with the leads projecting into said apertures;

means for securing a grid with inserts holding networks therein to a circuit board, the board being on the side of said grid from which the networks are inserted into said nests; and automatic lead connecting means including a lead connecting tool adapted to fit within said apertures for connecting a network lead to a conductor on said board.

means for scanning said grid to bring said tool into registration with each of said openings in order, and means responsive to the presence of an insert within one of said grid openings for initiating operation of said tool to connect the leads of a component held in that insert to said board, whereby networks may be connected to a circuit board in any of a large variety of configurations which conform to the pattern of said grid.

23. Apparatus as set forth in claim 22 in which each bridge member includes a plurality of projections which are in alignment wtih network lead positions in said nest and in which said lead connecting means includes detecting means for sensing the presence of a projection at said tool and for initiating an operation of said tool to connect the respective lead.

24. The method of attaching terminals of electrical components to circuit boards, comprising:

the provision of a grid having an array of openings for receiving removable bridge portions formed as nests extending across the openings;

locating electrical components in the nests with their terminals extending oppositely from the bridge portions;

locating bridge portions containing components in certain of the openings, whereby said terminals of the electrical components are exposed in said openings on opposite sides of the respective bridges and near one side of the grid;

applying a circuit board on said side of the grid to place its circuits adjacent said terminals;

holding the circuit board so applied to form an assembly;

turning over the assembly, whereby the terminals are exposed on opposite sides of the bridge portions in the openings of the grid;

moving the assembly under a lead connecting tool means to engage it sequentially with the terminals to join them with the circuit on the board; and removing the board and connected components from the bridge portions and grid.

References Cited

UNITED STATES PATENTS

| | | |
|---|---|---|
| 2,743,693 | 5/1956 | Schaper. |
| 3,051,026 | 8/1962 | Da Costa. |
| 3,161,753 | 12/1964 | Schmick. |
| 3,278,717 | 10/1966 | Rzant. |
| 3,310,867 | 3/1967 | Ehrat et al. |
| 3,319,038 | 5/1967 | Meister et al. |

FOREIGN PATENTS

| | | |
|---|---|---|
| 242,183 | 1/1963 | Australia. |

RICHARD M. WOOD, *Primary Examiner.*

B. A. STEIN, *Assistant Examiner.*